United States Patent
Park

(10) Patent No.: US 7,222,282 B2
(45) Date of Patent: May 22, 2007

(54) EMBEDDED MICRO COMPUTER UNIT (MCU) FOR HIGH-SPEED TESTING USING A MEMORY EMULATION MODULE AND A METHOD OF TESTING THE SAME

(75) Inventor: Jin-Kwon Park, Suwon-si (KR)

(73) Assignee: Samsung Electronics Co., Ltd., Suwon-Si (KR)

( * ) Notice: Subject to any disclaimer, the term of this patent is extended or adjusted under 35 U.S.C. 154(b) by 330 days.

(21) Appl. No.: 11/013,116

(22) Filed: Dec. 15, 2004

(65) Prior Publication Data
US 2005/0160333 A1 Jul. 21, 2005

(30) Foreign Application Priority Data
Jan. 5, 2004 (KR) .................. 10-2004-0000366

(51) Int. Cl.
*G06F 11/00* (2006.01)
(52) U.S. Cl. ..................... 714/741; 714/733
(58) Field of Classification Search ........... 713/1; 703/23; 717/128; 714/724, 45, 741, 733
See application file for complete search history.

(56) References Cited

U.S. PATENT DOCUMENTS 5,504,903 A * 4/1996 Chen et al. ............ 713/1
5,617,531 A * 4/1997 Crouch et al. .......... 714/30
5,689,684 A * 11/1997 Mulchandani et al. ....... 703/23
5,701,488 A * 12/1997 Mulchandani et al. ...... 717/128
5,801,972 A * 9/1998 Konno .................. 714/724
6,249,893 B1 6/2001 Rajsuman et al. ........... 714/741
6,493,839 B1 12/2002 Miner ................... 714/718
6,877,114 B2 * 4/2005 Allen et al. ............ 714/45

FOREIGN PATENT DOCUMENTS

KR 1020030023850 A 3/2003
KR 03-056186 7/2003

* cited by examiner

*Primary Examiner*—David Ton
(74) *Attorney, Agent, or Firm*—F. Chau & Associates, LLC

(57) ABSTRACT

Provided are an embedded micro computer unit (MCU) using a memory emulation module and a method of testing the embedded MCU. The embedded MCU includes an internal memory that is connected to bus master devices for storing temporary data of the bus master devices and a test vector in a test mode, a memory controller for accessing the internal memory or an external memory when a processor core is operated, and a memory emulation module that is connected between the memory controller and the internal memory for storing the test vector in the internal memory in the test mode.

14 Claims, 5 Drawing Sheets

US 7,222,282 B2

EMBEDDED MICRO COMPUTER UNIT (MCU) FOR HIGH-SPEED TESTING USING A MEMORY EMULATION MODULE AND A METHOD OF TESTING THE SAME

CROSS-REFERENCE TO RELATED APPLICATION

This application claims priority to Korean Patent Application No. 2004-366, filed on Jan. 5, 2004, in the Korean Intellectual Property Office, the disclosure of which is incorporated herein in its entirety by reference.

FIELD OF THE INVENTION

The present invention relates to an embedded micro computer unit (MCU), and more particularly, to an embedded MCU for high-speed testing using a memory emulation module and a method of testing the same.

DESCRIPTION OF THE RELATED ART

Application specific integrated circuit (ASIC) technology has been developed for a single chipset and more recently for a system-on-a-chip (SoC) having an embedded core. SoC ICs include various reusable function blocks such as microprocessors, interfaces, memory arrays and digital signal processors. A pre-designed function block is typically called a 'core'.

FIG. 1 shows an example of a conventional embedded micro computer unit (MCU) 100. Referring to FIG. 1, the embedded MCU 100 includes a processor core 110, bus master devices 120, a memory controller 130, and an internal memory block 140. The processor core 110, bus master devices 120, and memory controller 130 share a BUS. The memory controller 130 controls data transmission between an external memory 150 via an input/output (I/O) pad 160 and the internal memory block 140 of the embedded MCU 100.

Tests for confirming functions of the embedded MCU 100 include a fault test and a delay fault test. The fault test confirms a change in a logic state from '1' to '0' or '0' to '1', that is, a toggled result, irrespective of time. The delay fault test includes time as a factor when the logic states are toggled. The delay fault test operates the embedded MCU 100 at 100 MHz, for example, to confirm whether the embedded MCU 100 is operating or not. Thus, as the operating speed of semiconductor devices increases, the delay fault test is becoming more important.

When the embedded MCU 100 is tested using the delay fault test, the test is carried out at the actual operating speed of the embedded MCU 100. Specifically, a test vector is applied to the embedded MCU 100 and an output of the embedded MCU 100 is confirmed under test conditions as shown, for example, in FIGS. 2 and 3. At these operating speeds, however, testing is difficult to perform because of input and output timing margins.

FIG. 2 shows circuit paths through which an external clock signal EXT.CLK input to the I/O pad 160 of the embedded MCU 100, an internal clock signal EMCLK generated by an internal circuit that receives the external clock signal EXT.CLK, and a data signal DOUT output to the I/O pad 160 of the embedded MCU 100 in response to the internal clock signal EMCLK are generated. FIG. 3 shows timing margins of the output data signal DOUT in response to the internal clock signal EMCLK with respect to the external clock signal EXT.CLK. In FIG. 3, EMCLK(bst) represents the best state in which the internal clock signal EMCLK is generated quickly after the external clock signal EXT.CLK is generated, EMCLK(typ) represents a typical state in which the internal clock signal EMCLK is generated slower than that of the EMCLK(bst) state after the external clock signal EXT.CLK is generated, and EMCLK(wst) represents the worst state in which the internal clock signal EMCLK is generated slower than that of the EMCLK(bst) and EMCLK(typ) states after the generation of the external clock signal EXT.CLK.

As shown in FIG. 3, the center of the output data signal DOUT does not correspond to the edge of the external clock signal EXT.CLK in the best and worst states. Accordingly, an input margin of the external clock signal EXT.CLK is taken into consideration when determining a setup time of the embedded MCU 100 for testing. However, when the embedded MCU 100 is operated at a high frequency such as several hundred MHz, it is difficult to test the embedded MCU 100 using an external test vector because of the resistance characteristics of the I/O pad 160 of the embedded MCU 100. Therefore, an embedded MCU for high-speed testing is desired.

SUMMARY OF THE INVENTION

According to an aspect of the present invention, there is provided an embedded micro computer unit (MCU) comprising an internal memory block for storing a test vector provided by an external device; a memory controller for controlling the internal memory block; and a memory emulation module block that is connected between the memory controller and the internal memory block for storing the test vector in the internal memory block in a test mode.

The memory emulation module block includes an address mapping register for setting a region of the internal memory block that is accessed by the memory controller, an address decoder for addressing the region of the internal memory block that is accessed by the memory controller, and an access control signal converter for converting external memory access signals to predetermined access signals in response to the type of the internal memory block.

According to another aspect of the present invention, there is provided an embedded MCU comprising a bus to which a processor core and bus master devices are connected; an internal memory block that is connected to the bus master devices to store temporary data of the bus master devices and to store a test vector in a test mode; and a memory controller that accesses the internal memory block or an external memory when the processor core is operated. The embedded MCU further comprises a memory emulation module block that is connected between the memory controller and the internal memory block and stores the test vector in the internal memory block in the test mode; a first selector for selectively connecting the external memory and the memory emulation module block to the memory controller; and a second selector for selectively connecting the bus master devices and the memory emulation module block to the internal memory block.

According to another aspect of the present invention, there is provided a method of testing an embedded MCU, the method comprising receiving a test vector for testing the embedded MCU; setting a region of an internal memory block in which the test block will be stored using a memory emulation module; and generating an access signal for accessing the set region of the internal memory block. The method further comprises storing the test vector in the set region of the internal memory block; testing the embedded MCU according to the test vector stored in the internal memory block; and outputting a test result.

BRIEF DESCRIPTION OF THE DRAWINGS

The above and other features of the present invention will become more apparent by describing in detail exemplary embodiments thereof with reference to the attached drawings in which.

DETAILED DESCRIPTION OF EXEMPLARY EMBODIMENTS OF THE INVENTION

Figure 1:
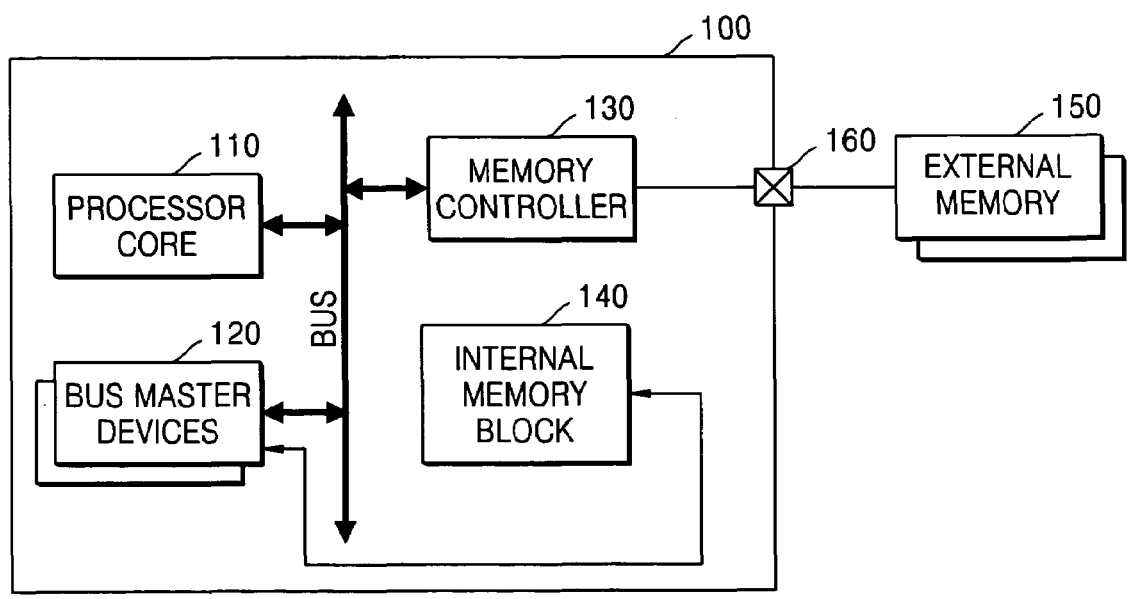
FIG. 1 shows the internal structure of a conventional embedded micro computer unit (MCU) connected to an external memory.
Figure 2:
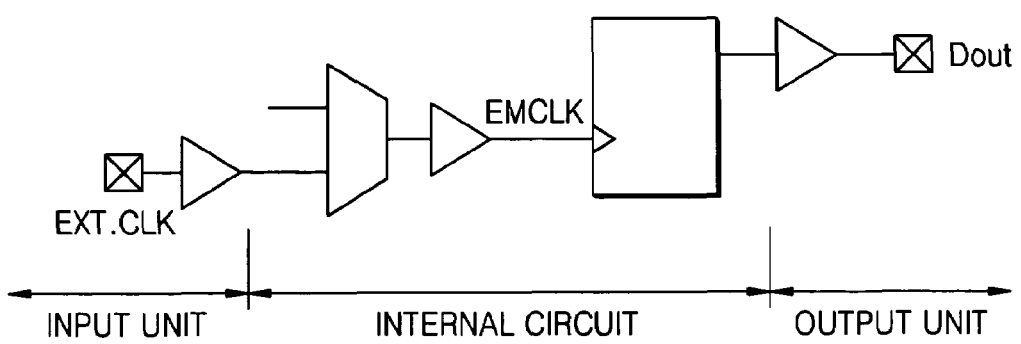
FIG. 2 shows circuit paths of the embedded MCU shown in FIG. 1.
Figure 3:
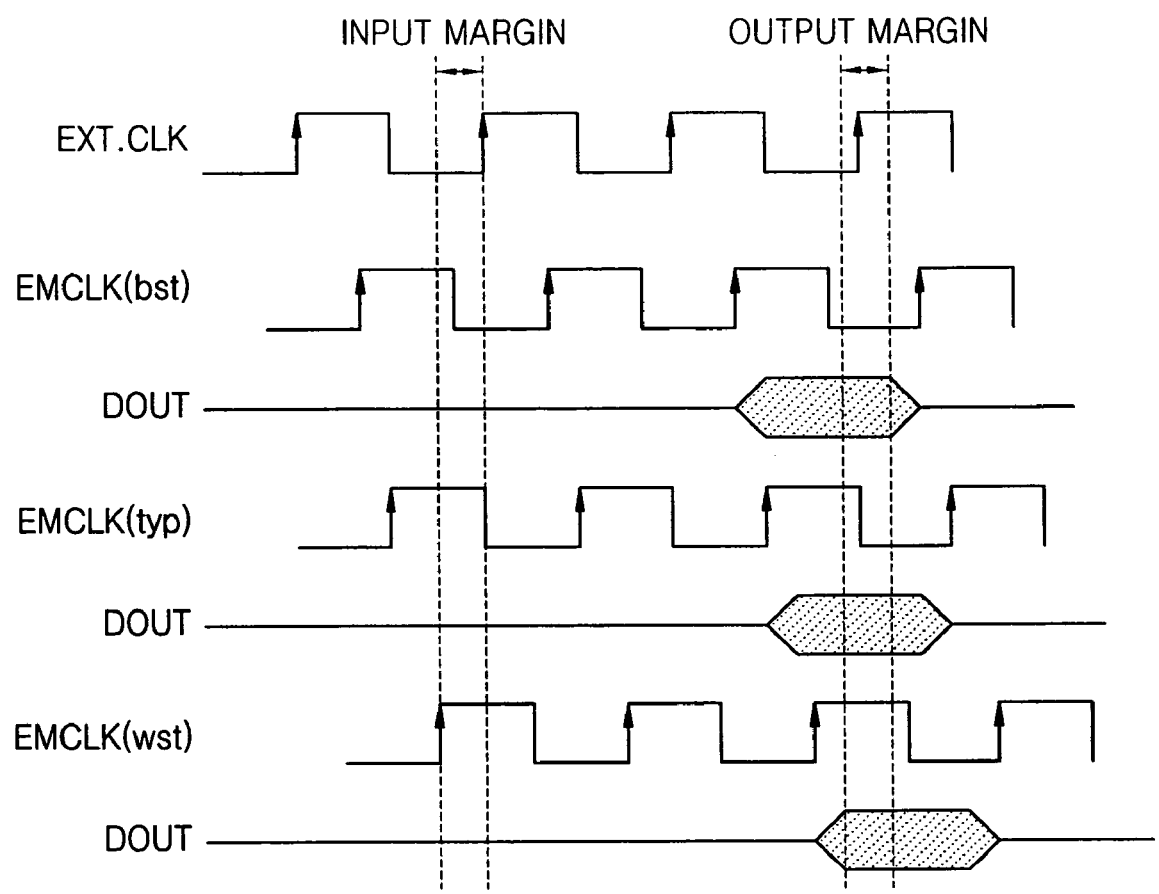
FIG. 3 is a timing diagram showing relationships between clock signals generated in the circuit paths of FIG. 2 and output data.
Figure 4:
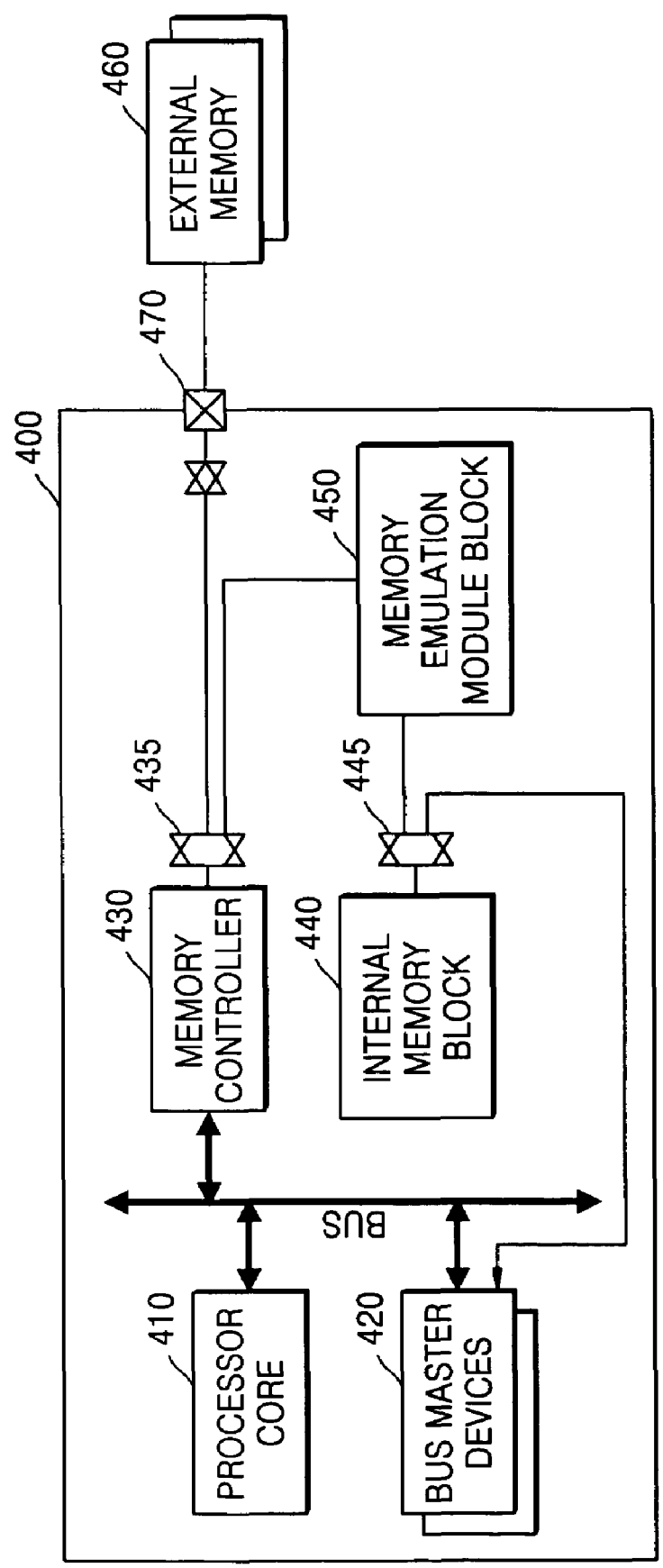
FIG. 4 shows an embedded MCU according to an exemplary embodiment of the present invention.

FIG. 4 shows an embedded micro computer unit (MCU) 400 according to an exemplary embodiment of the present invention. Referring to FIG. 4, the embedded MCU 400 includes a processor core 410, bus master devices 420, a memory controller 430, an internal memory block 440, first and second selectors 435 and 445, and a memory emulation module block 450. The memory emulation module block 450 is connected to the memory controller 430 through the first selector 435 and is connected to the internal memory block 440 through the second selector 445. The embedded MCU 400 is connected to an external memory or memories 460 through an input/output (I/O) pad or pads 470.

Figure 5:
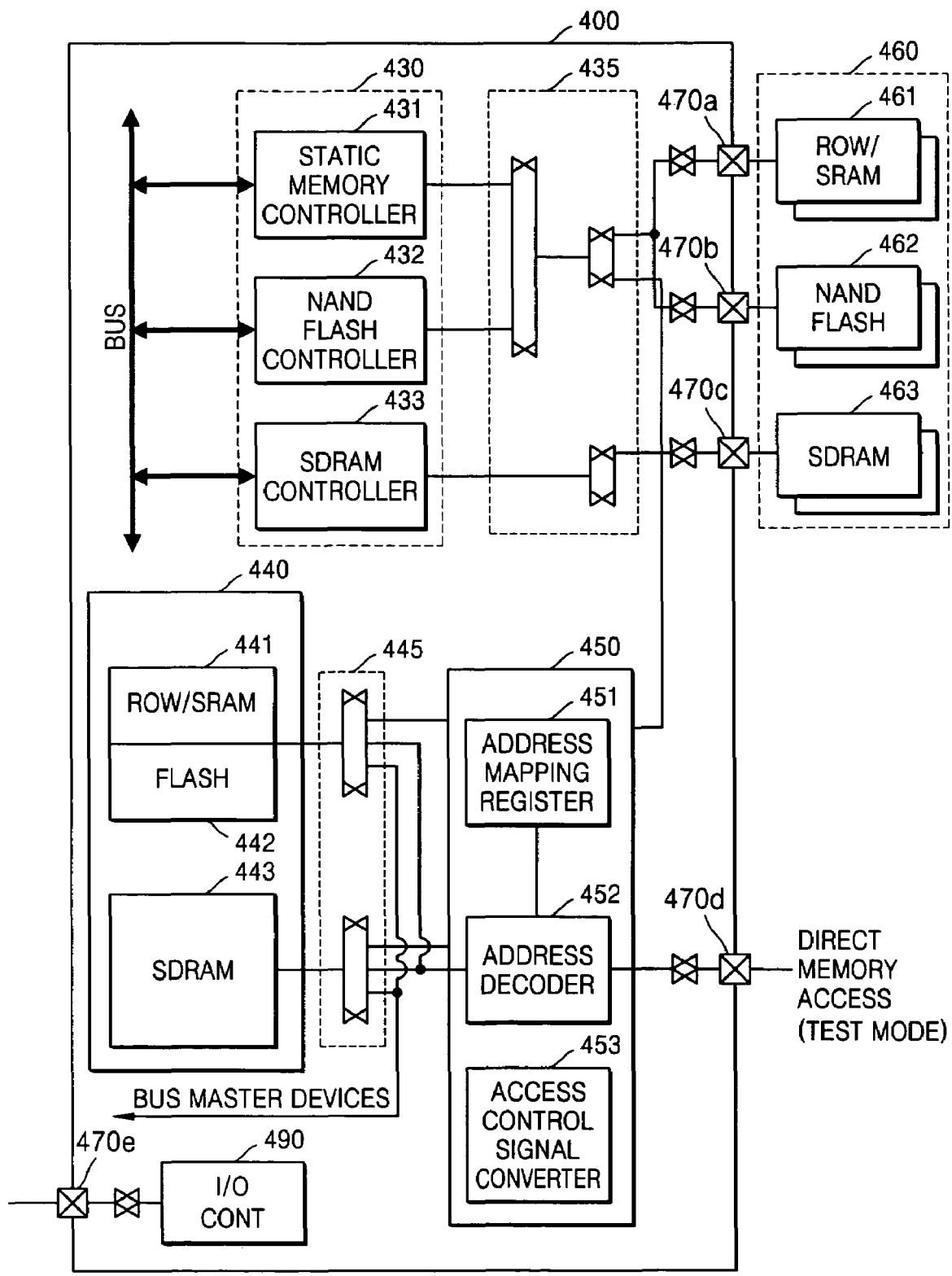
FIG. 5 shows the internal structure of the embedded MCU of FIG. 4.

FIG. 5 shows the internal structure of the embedded MCU 400 (absent the processor core 410 and bus master devices 420). Referring to FIG. 5, the memory emulation module block 450 includes an address mapping register 451, an address decoder 452, and an access control signal converter 453. The internal memory block 440 connected to the memory emulation module block 450 through the second selector 445 includes a read-only memory/static random access memory (ROM/SRAM) block 441, a FLASH memory block 442, and a synchronous dynamic random access memory (SDRAM) block 443. The internal memory block 440 is connected to the bus master devices 420 through the second selector 445. Accordingly, the bus master devices 420 can temporary store data in the internal memory block 440 if required.

The memory controller 430 includes a static memory controller 431, a NAND FLASH controller 432 and an SDRAM controller 433. The external memory 460 includes ROM/SRAM blocks 461, NAND FLASH blocks 462 and SDRAM blocks 463. The external memory 460 is connected to the embedded MCU 400 through I/O pads 470a, 470b and 470c. The memory emulation module block 450 may be further connected to an external device via an I/O pad 470d.

Figure 7:
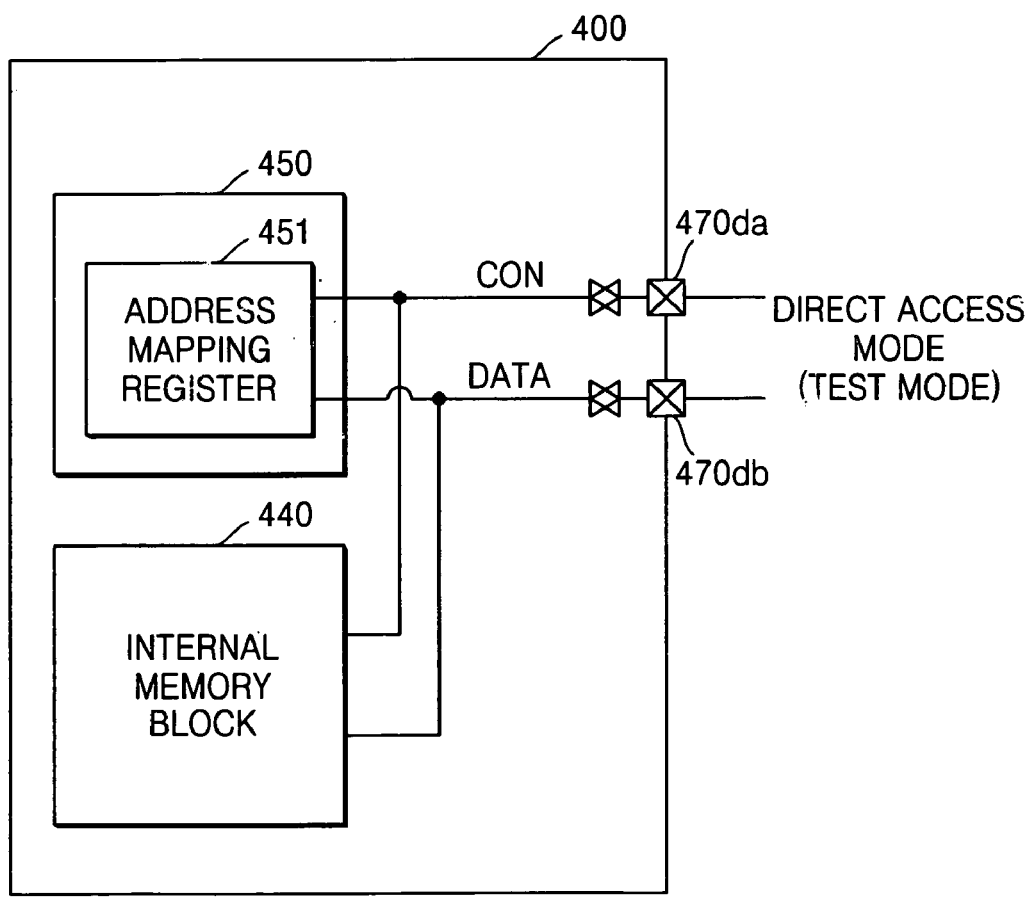
FIG. 7 shows a process of loading an initial memory value into an internal memory block of the embedded MCU of FIG. 4.

The address mapping register 451 of the memory emulation module block 450 sets regions of the internal memory block 440 that are accessed by the memory controller 430 because the internal memory block 440 typically has a capacity smaller than that of the external memory 460. Referring to FIG. 7, which illustrates the internal memory block 440 and a portion of the memory emulation module block 450 of the embedded MCU 400, the address mapping register 451 stores a control signal CON and data signal DATA when data initially stored in the external memory 460 is loaded into the internal memory block 440 and transmits the control signal CON and data signal DATA to the internal memory block 440. As shown in FIG. 7, the control signal CON and data signal DATA may be received from an external device via I/O pads 470da and 470db. Referring back to FIG. 5, the address decoder 452 decodes a memory access signal that is input to the address decoder 452 to cause the memory controller 430 to access the memory regions set by the address mapping register 451.

Figure 6:
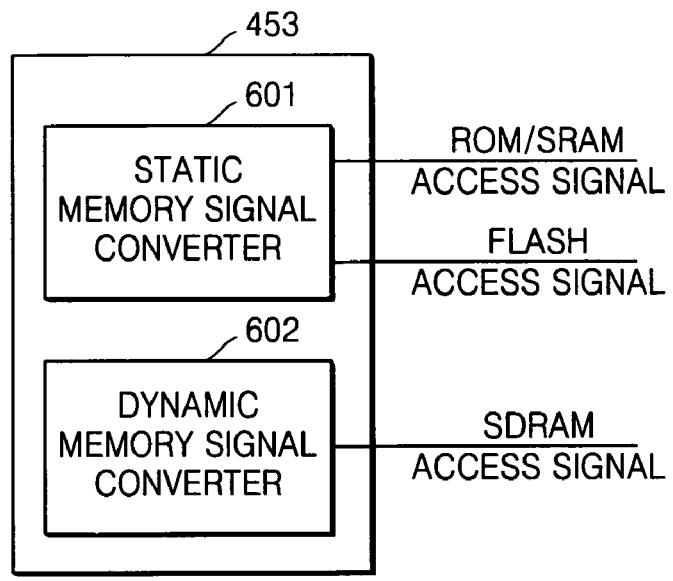
FIG. 6 shows an access control signal converter of FIG. 5.

The access control signal converter 453 is shown in FIG. 6 in detail. The access control signal converter 453 converts external memory access signals to corresponding memory access signals such as ROM/SRAM, FLASH, and SDRAM in a direct memory access mode (test mode). The access control signal converter 453 includes a static memory signal converter 601 that converts external memory access signals to signals for accessing the ROM/SRAM 441 or FLASH 442 blocks of the internal memory block 440, and a dynamic memory signal converter 602 that converts an external memory access signal to a signal for accessing the SDRAM 443 block of the internal memory block 440. Referring back to FIG. 5, an operating result of the embedded MCU 400 according to a test vector stored in the internal memory block 440 is output through an I/O controller 490 via an I/O pad 470e. The I/O controller 490 may be connected to the BUS or the second selector 445.

Thus, according to an exemplary embodiment of the present invention, the embedded MCU 400 can be tested at its actual operating speed because the memory emulation module block 450 included in the embedded MCU 400 loads the test vector into the internal memory block 440 when the embedded MCU 400 is tested.

While the present invention has been particularly shown and described with reference to exemplary embodiments thereof, it will be understood by those of ordinary skill in the art that various changes in form and details may be made therein without departing from the spirit and scope of the present invention as defined by the following claims.

What is claimed is:

1. An embedded micro computer unit (MCU) comprising:
    an internal memory for storing a test vector from an external device;
    a memory controller for controlling the internal memory; and
    a memory emulation module for storing the test vector in the internal memory in a test mode.

2. The embedded MCU as claimed in claim 1, wherein the memory emulation module comprises:
    an address mapping register for setting a region of the internal memory that is accessed by the memory controller;
    an address decoder for addressing the region of the internal memory that is accessed by the memory controller; and
    an access control signal converter for converting external memory access signals into access signals based on a type of the internal memory.

3. The embedded MCU as claimed in claim 2, wherein the type of the internal memory is one of a read-only memory/ static random access memory, flash memory, and synchronous dynamic random access memory.

4. The embedded MCU as claimed in claim 2, wherein the access control signal converter comprises:
a static memory signal converter for converting the external memory access signals into signals for accessing read-only memory/static random access memory and flash memory regions of the internal memory; and
a dynamic memory signal converter for converting the external memory access signals into signals for accessing a synchronous dynamic random access memory region of the internal memory.

5. The embedded MCU as claimed in claim 1, further comprising:
a first selector for connecting the external device and the memory emulation module to the memory controller; and
a second selector for connecting bus master devices and the memory emulation module to the internal memory.

6. The embedded MCU as claimed in claim 1, wherein the memory emulation module is connected between the memory controller and the internal memory.

7. An embedded micro computer unit (MCU) comprising:
a bus connected to a processor core and bus master devices;
an internal memory connected to the bus master devices for storing temporary data from the bus master devices and for storing a test vector in a test mode;
a memory controller for accessing one of the internal memory and an external memory when the processor core is operating;
a memory emulation module connected between the memory controller and the internal memory for storing the test vector in the internal memory in the test mode;
a first selector for connecting the external memory and the memory emulation module to the memory controller; and
a second selector for connecting the bus master devices and the memory emulation module to the internal memory.

8. The embedded MCU as claimed in claim 7, wherein the memory emulation module comprises:
an address mapping register for setting a region of the internal memory that is accessed by the memory controller;
an address decoder for addressing the region of the internal memory that is accessed by the memory controller; and
an access control signal converter for converting external memory access signals into access signals based on a type of the internal memory.

9. The embedded MCU as claimed in claim 8, wherein the type of the internal memory is one of a read-only memory/static random access memory, flash memory, and synchronous dynamic random access memory.

10. The embedded MCU as claimed in claim 7, further comprising:
an input/output (I/O) controller for outputting a test result according to the test vector stored in the internal memory.

11. A method of testing an embedded micro computer unit (MCU), comprising:
receiving a test vector for testing the embedded MCU;
setting a region of an internal memory for storing a test vector using a memory emulation module;
generating an access signal for accessing the set region of the internal memory;
storing the test vector in the set region of the internal memory;
testing the embedded MCU according to the test vector stored in the internal memory; and
outputting a test result.

12. The method as claimed in claim 11, further comprising:
storing a control signal and a data signal when data from an external device is loaded into the internal memory using the memory emulation module; and
transmitting the control signal and the data signal to the internal memory using the memory emulation module.

13. The method as claimed in claim 11, wherein the step of generating an access signal for accessing the set region of the internal memory comprises:
converting an external memory access signal into an access signal for accessing the internal memory based on a type of the internal memory.

14. The method as claimed in claim 13, wherein the type of the internal memory is one of a read-only memory/static random access memory, flash memory, and synchronous dynamic random access memory.

* * * * *